(12) United States Patent
Peana

(10) Patent No.: US 9,961,814 B2
(45) Date of Patent: May 1, 2018

(54) TOUCH PANEL DEVICE AND METHOD FOR ASSEMBLY OF A TOUCH PANEL DISPLAY

(71) Applicant: Dell Products, LP, Round Rock, TX (US)

(72) Inventor: Stefan Peana, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 282 days.

(21) Appl. No.: 13/691,420

(22) Filed: Nov. 30, 2012

(65) Prior Publication Data

US 2014/0153160 A1   Jun. 5, 2014

(51) Int. Cl.
*G06F 3/044*   (2006.01)
*H05K 13/00*  (2006.01)

(52) U.S. Cl.
CPC ............ *H05K 13/00* (2013.01); *G06F 3/044* (2013.01); *G02F 2202/28* (2013.01); *G06F 2203/04103* (2013.01); *H03K 2217/960755* (2013.01); *Y10T 156/10* (2015.01)

(58) Field of Classification Search
CPC .................................................. G02F 2202/28
USPC ......................................................... 349/12
See application file for complete search history.

(56) References Cited

U.S. PATENT DOCUMENTS

| | | |
|---|---|---|
| 6,254,115 B1 | 7/2001 | Lin |
| 6,842,288 B1 | 1/2005 | Liu et al. |
| 6,905,219 B2 | 6/2005 | Gaides |
| 2008/0278456 A1* | 11/2008 | Huang ........................... 345/173 |
| 2009/0128431 A1* | 5/2009 | Martin ........................... 343/713 |
| 2009/0183098 A1 | 7/2009 | Casparian et al. |
| 2009/0195516 A1* | 8/2009 | Kuo ....................... G06F 3/0412 345/174 |
| 2010/0020022 A1 | 1/2010 | Russell et al. |
| 2010/0033443 A1* | 2/2010 | Hashimoto ........... G06F 3/0418 345/173 |
| 2010/0085326 A1* | 4/2010 | Anno ............................ 345/174 |
| 2010/0321318 A1* | 12/2010 | Oohira ......................... 345/173 |
| 2010/0328571 A1* | 12/2010 | Itaya .............................. 349/58 |
| 2011/0005662 A1* | 1/2011 | Sung ............................ 156/153 |
| 2011/0020640 A1* | 1/2011 | Sherman ................ C09J 7/0207 428/343 |
| 2011/0084939 A1* | 4/2011 | Gepner .................. G06F 3/0421 345/175 |
| 2011/0187960 A1* | 8/2011 | Kobayashi ................ H01J 9/20 349/58 |
| 2011/0188170 A1 | 8/2011 | Grigorian et al. |
| 2011/0253301 A1* | 10/2011 | Yamanaka ................ B32B 7/12 156/247 |
| 2012/0105359 A1* | 5/2012 | Kim ........................ G06F 3/045 345/174 |

(Continued)

*Primary Examiner* — Edmond Lau
(74) *Attorney, Agent, or Firm* — Larson Newman, LLP

(57) ABSTRACT

A method includes providing a touch panel interposer, where providing the touch panel interposer comprises providing a touch panel device, applying a first adhesive layer to a cover side of the touch panel device, and applying a second adhesive layer to a display side of the touch panel device. The method further includes providing a touch panel display, where providing the touch panel display comprises applying a cover to the first adhesive layer, and applying a display panel to the second adhesive layer.

17 Claims, 4 Drawing Sheets

(56) References Cited

U.S. PATENT DOCUMENTS

2013/0307810 A1* 11/2013 Verweg .................. G06F 3/044
                                                                                        345/174

* cited by examiner

TOUCH PANEL DEVICE AND METHOD FOR ASSEMBLY OF A TOUCH PANEL DISPLAY

FIELD OF THE DISCLOSURE

This disclosure relates generally to information handling systems, and relates more particularly to assembly of a touch panel display.

BACKGROUND

As the value and use of information continues to increase, individuals and businesses seek additional ways to process and store information. One option is an information handling system. An information handling system generally processes, compiles, stores, or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, data storage systems, and networking systems. An information handling system can include virtual machines that run operating systems and applications on a common host system. An information handling system can include a display for presenting information to a user. The display can include a touch panel device that permits the user to provide inputs to the information handling system through direct interaction with the display.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are illustrated and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion focuses on specific implementations and embodiments of the teachings. This focus is provided to assist in describing the teachings, and should not be interpreted as a limitation on the scope or applicability of the teachings. However, other teachings can be used in this application. The teachings can also be used in other applications, and with several different types of architectures, such as distributed computing architectures, client/server architectures, or middleware server architectures and associated resources.

Figure 1:
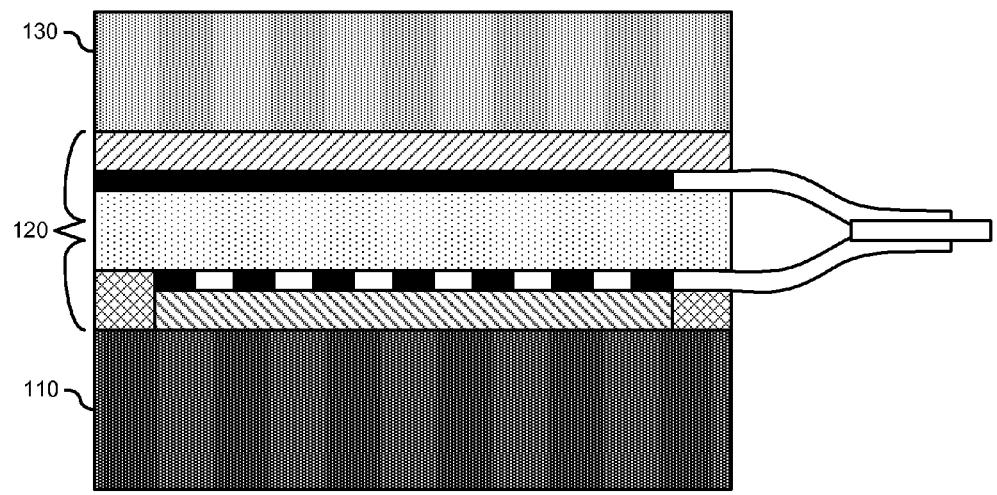
FIG. 1 is a diagram of a touch panel display according to an embodiment of the present disclosure.

FIG. 1 illustrates a touch panel display 100 for an information handling system. For purpose of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic, and operates to execute code. Additional components of the information handling system may include one or more storage devices that can store code, one or more communications ports for communicating with external devices as well as various input and output (I/O) devices, such as a keyboard, a mouse, and a video display. The information handling system may also include one or more buses operable to transmit communications between the various hardware components.

Touch panel display 100 includes a liquid crystal display (LCD) panel 110, a direct-bonded touch panel interposer 120, and a cover 130. LCD panel 110 represents a video display device that presents video information from an information handling system (not illustrated) by varying light conducting properties of liquid crystals. Various types of LCD panels are known in the art, and therefore the construction and operation of LCD panel 110 will not be further described herein. The skilled artisan will recognize that LCD panel 110 can also represent other types of video display devices, as needed or desired. Direct-bonded touch panel interposer 120 includes a touch panel device, described below, that represents an input device for the information handling system that detects the presence and location of a touch within a display area of the direct-bonded touch panel interposer, and that is transparent so as to permit the video information from LCD panel 110 to pass through to a user of the information handling system. Cover 130 represents a cover for touch panel display 100 that provides a durable surface for user interactions with direct-bonded touch panel interposer 120, and is configured to permit the video information from LCD panel 110 to pass through to the user, and to permit the interaction from the user to be detected by the direct-bonded touch panel interposer. In a particular embodiment, cover 130 is rigid so as to provide mechanical support for touch panel display 100 within an information handling system. An example of a cover includes a glass cover, an acrylic cover, or another cover, as needed or desired. Touch panel display 100 is constructed such that direct-bonded touch panel interposer 120 is adhered to LCD panel 110 and to cover 130, as described below. Direct-bonded touch panel interposer 120 is distinguished by the presence of a fill adhesive that operates to bond the direct-bonded touch panel interposer directly to the surface of LCD panel 110, as described below.

Figure 2:
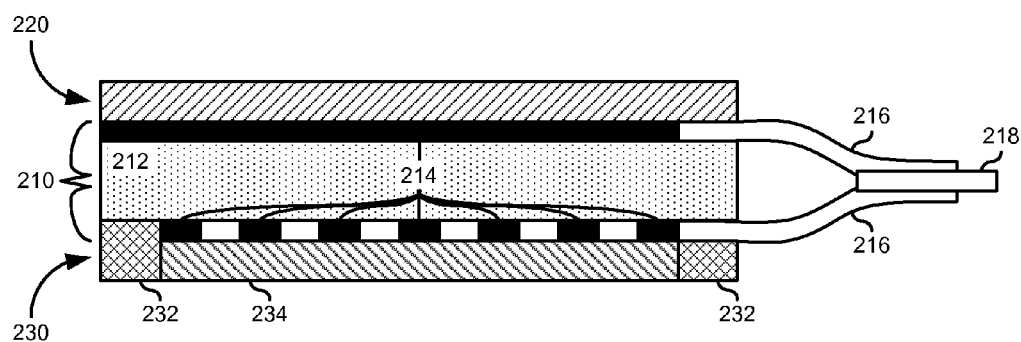
FIG. 2 is a diagram of a direct-bonded touch panel interposer of FIG. 1.

FIG. 2 illustrates a direct-bonded touch panel interposer 200 similar to direct-bonded touch panel interposer 120, including a touch panel device 210, a cover adhesive layer 220, and an LCD panel adhesive layer 230. Touch panel device 210 includes a touch panel substrate 212, upper and lower electrodes 214, upper and lower electrode contacts 216, and a connector 218. An example of a touch panel device includes a projected capacitive panel, a mutual capacitive panel, a self capacitive panel, or another type of touch panel, as needed or desired. The operation of touch panel devices is known in the art, therefore the operation of touch panel device 210 will not be further described herein.

Cover adhesive layer 220 is adhered to one surface of touch panel device 210, and provides an adhesive surface for bonding a cover similar to cover 130 to direct-bonded touch panel interposer 200. In a particular embodiment, cover adhesive layer 220 represents a pressure sensitive adhesive that is applied to the surface of touch panel device 210, and that retains an adhesive property on the open side, so that the cover can be applied at a later manufacturing stage. In another embodiment, cover adhesive layer 220 represents an adhesive liquid or gel, such as an acrylic adhesive, a silicone adhesive, another adhesive liquid or gel, or the like, and that is applied to the surface of touch panel device 210. Here, the adhesive property of cover adhesive layer 220 is provided based upon a curing process that can be performed after the cover is applied. For example, cover adhesive layer 220 can be cured by being exposed to an ultra-violet (UV) light environment, by being heated, by being aged, by a combination thereof, or by other curing means as known in the adhesive arts. In either embodiment, the open side of cover adhesive layer 220 can be protected by a non-adhesive film which can be removed prior to bonding direct-bonded touch panel interposer 200 with the cover. Cover adhesive layer 220 also operates to permit video information from an LCD panel to pass through to a user, and to permit interactions from the user to be detected by touch panel device 210.

LCD panel adhesive layer 230 includes a barrier adhesive 232 and a fill adhesive 234. Barrier adhesive 232 is adhered around the edge of touch panel device 210 to form a barrier to enclose fill adhesive 234. In a particular embodiment, barrier adhesive 232 is applied to a bezel of touch panel device 210. Fill adhesive 234 is adhered to the second surface of touch panel device 210, and, together with barrier adhesive 232, provides an adhesive surface for bonding an LCD panel similar to LCD panel 110 to direct-bonded touch panel interposer 200. In a particular embodiment, barrier adhesive 232 and fill adhesive 234 represents one or more adhesive liquids or gels, and the adhesive properties are provided based upon one or more curing processes that can be performed after the LCD panel is applied. Here, barrier adhesive 232 is selected so as to provide a strong attachment between touch panel device 210 and the LCD panel, and may or may not be transparent, as needed or desired, and fill adhesive 234 is selected so as to provide a transparent adhesive layer between the touch panel device and the LCD panel. In another embodiment, LCD panel adhesive layer 230 represents a pressure sensitive adhesive that is applied to the second surface of touch panel device 210, and that retains an adhesive property on the open side, so that the LCD panel can be applied at a later manufacturing stage. In either embodiment, the open side of LCD panel adhesive layer 230 can be protected by a non-adhesive film which can be removed prior to bonding direct-bonded touch panel interposer 200 with the LCD panel. In either case, some portion of LCD panel adhesive layer 230 operates to permit video information from the LCD panel to pass through to the user.

In a particular embodiment, one or more of cover adhesive layer 220 and LCD panel adhesive layer 230 is applied as a film, such as a double sided tape layer, to touch panel device 210. In another embodiment, one or more of cover adhesive layer 220 and LCD panel adhesive layer 230 is applied by a spray-on or print process, or the like. In either case, the adhesives can be applied in a roll process that is an extension of the manufacturing process of touch panel device 210, or can be applied as a separate process after the touch panel device is manufactured. For example, where multiple touch panel devices are manufactured simultaneously, the adhesive layers can be simultaneously applied to the multiple touch panel devices, and then the touch panel device can be separated, or the touch panel devices can be separated prior to the application of the adhesive layers. In a particular embodiment, one or more of cover adhesive layer 220 and LCD panel adhesive layer 230 can include ink or another filler so as to modify the optical qualities of the adhesives, to provide a tint or to otherwise change the color of the light propagated through the adhesive, to filter the propagated light, to modify or enhance the adhesive properties of the adhesives, to change the curing properties of the adhesive, or for other purposes, as needed or desired.

Figure 3:
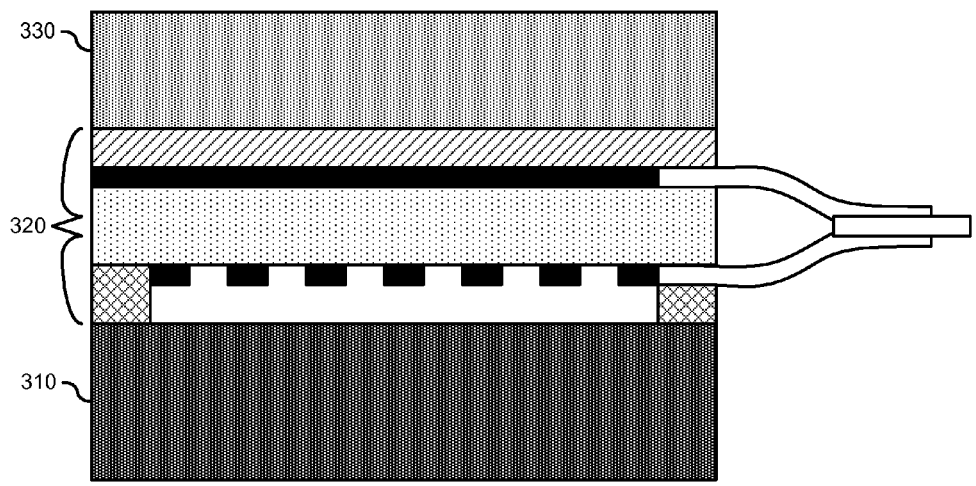
FIG. 3 is a diagram of a touch panel display according to another embodiment of the present disclosure.

FIG. 3 illustrates a touch panel display 300 similar to touch panel display 100 including an LCD panel 310, an air-gap-bonded touch panel interposer 320, and a cover 330. LCD panel 310 is similar to LCD panel 110. Air-gap-bonded touch panel interposer 320 is similar to direct-bonded touch panel interposer 120, representing an input device for the information handling system that detects the presence and location of a touch within a display area of the touch panel interposer, and that is transparent, so as to permit the video information from LCD panel 310 to pass through to a user of the information handling system. Cover 330 is similar to cover 130. Air-gap-bonded touch panel interposer 320 is distinguished from direct-bonded touch panel interposer 120 by the absence of fill adhesive such that the air-gap-bonded touch panel interposer is bonded to the surface of LCD panel 310 by a barrier adhesive only, as described below.

Figure 4:
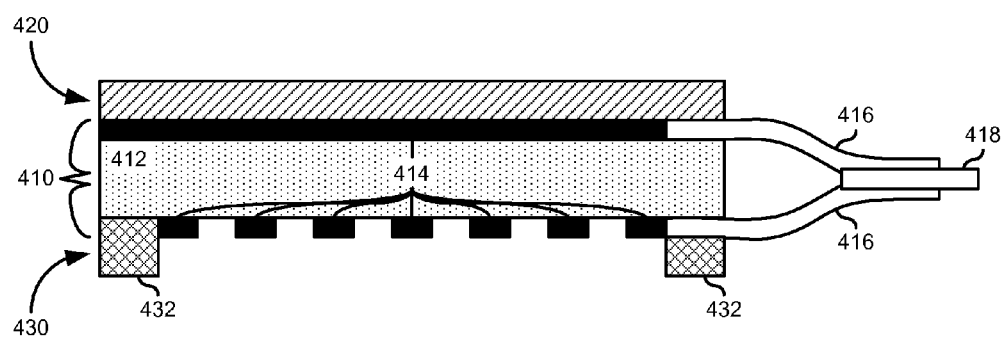
FIG. 4 is a diagram of a air-gap-bonded touch panel interposer of FIG. 3.

FIG. 4 illustrates an air-gap-bonded touch panel interposer 400 similar to air-gap-bonded touch panel interposer 320, including a touch panel device 410, a cover adhesive layer 420, and an LCD panel adhesive layer 430. Touch panel device 410 is similar to touch panel device 210 and includes a touch panel substrate 412, upper and lower electrodes 414, upper and lower electrode contacts 416, and a connector 418. Cover adhesive layer 420 is similar to cover adhesive layer 220, and is adhered to one surface of air-gap-bonded touch panel device 410 to provide an adhesive surface for bonding a cover similar to cover 330. LCD panel adhesive layer 430 includes an adhesive tape 432. Adhesive tape 432 is adhered around the edge of touch panel device 410 to form an environmental barrier to the surface of an attached LCD panel, and can be applied to a bezel of touch panel device 410. In a particular embodiment, adhesive tape 432 represents an adhesive liquid or gel, and the adhesive properties are provided based upon one or more curing processes that can be performed after the LCD panel is applied. Here, adhesive tape 432 is selected so as to provide a strong attachment and an environmental barrier between touch panel device 410 and the LCD panel, and may or may not be transparent, as needed or desired. In another embodiment, LCD panel adhesive layer 430 represents a pressure sensitive adhesive that is applied to the second surface of touch panel device 410, and that retains an adhesive property on the open side, so that the LCD panel can be applied at a later manufacturing stage. In either embodiment, the open side of LCD panel adhesive layer 430 can be protected by a non-adhesive film which can be removed prior to bonding air-gap-bonded touch panel interposer 400 with the LCD panel.

Figure 5:
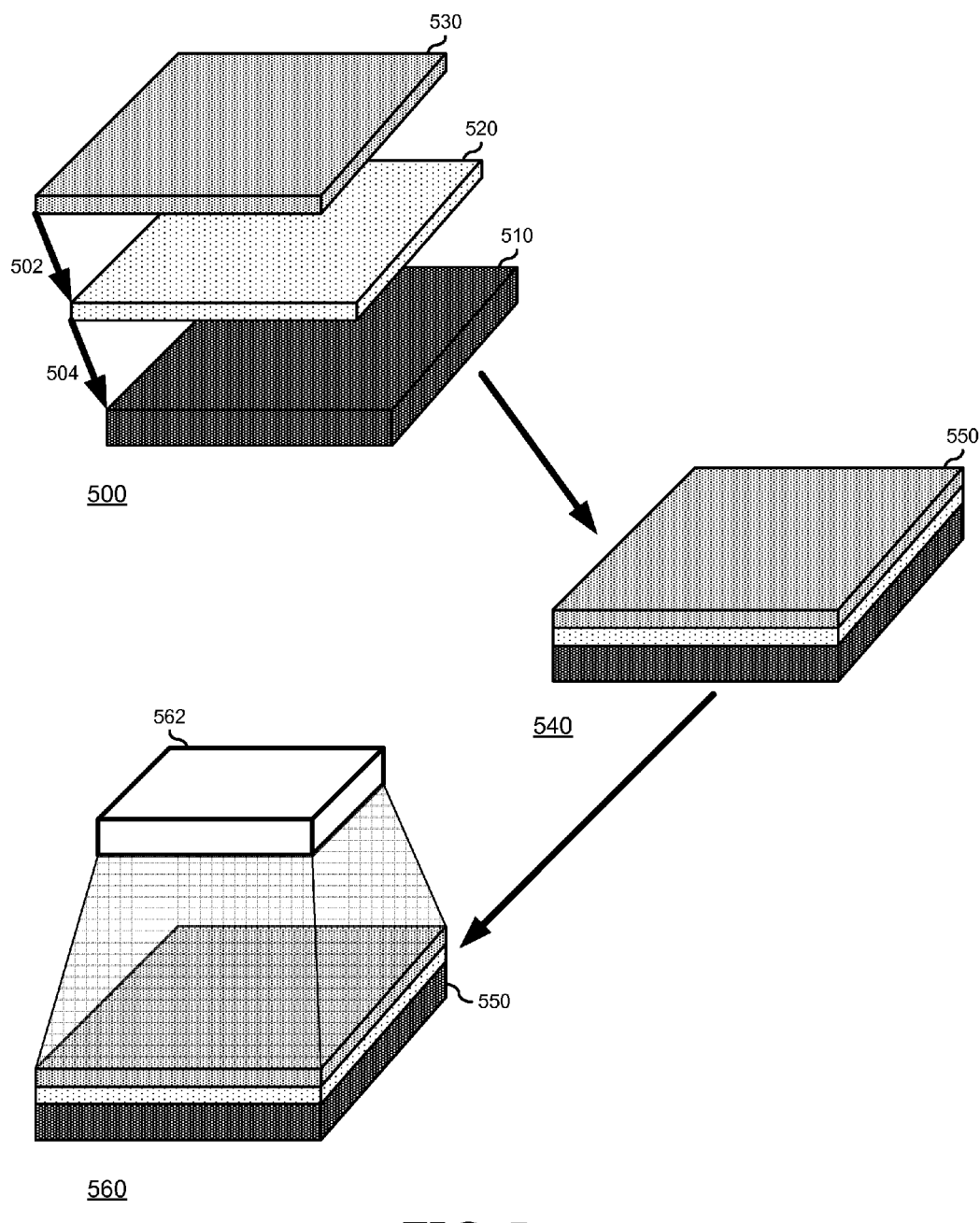
FIG. 5 is a diagram of an assembly process for touch panel displays according to an embodiment of the present disclosure.

FIG. 5 illustrates an assembly process for assembling touch panel displays similar to touch panel displays 100 or 300. The assembly process includes a mating step 500, a bonding step 540, and a curing step 550. In mating step 500, a touch panel interposer 520 and a cover 530 are mated together in a first process step 502, and the touch panel interposer and an LCD panel are mated together in a second process step 504. In a particular embodiment, touch panel interposer 520 and LCD panel 510 are mated together first, and then the touch panel interposer and cover 530 are mated together. In bonding step 540, the mated touch panel display 550 is completely assembled. In a particular embodiment, bonding step 540 includes applying pressure to more firmly adhere the elements of touch panel display 550 together. In another embodiment, an application of pressure can be performed as a part of either first or second process steps 502 and 504, as needed or desired. In curing step 560, touch panel display 550 is subjected to one or more curing processes 562 to complete the assembly process. For example, curing process 562 can include exposing touch panel display 550 to a UV light environment, to a high temperature environment, to an autoclave environment to dry and evacuate an air-gap-bonded touch panel display, by aging the touch panel display, by a combination thereof, or by other curing means as known in the adhesive arts.

Figure 6:
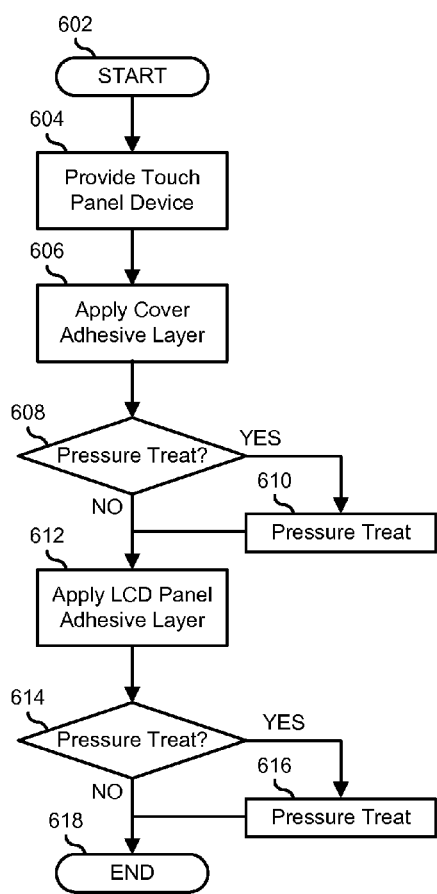
FIG. 6 is a flow diagram of a method of assembling a touch panel interposer according to an embodiment of the present disclosure.

FIG. 6 illustrates a method of assembling a touch panel interposer beginning at block 602. A touch panel device is provided at block 604. For example, a touch panel device can include a projected capacitive panel, a mutual capacitive panel, a self capacitive panel, or another type of touch panel, as needed or desired. The touch panel device can be made in a roll process where multiple touch panel devices are manufactured simultaneously, or can be made as separate touch panel devices. In a particular embodiment, the following steps of the method are performed as a part a roll process, where the steps are performed on multiple touch panel devices simultaneously. In another embodiment, the steps of the method are performed on individual touch panel devices. The skilled artisan will recognize that the steps of the method can be performed in a different order than the steps as illustrated, as needed or desired.

A cover adhesive layer is applied to the touch panel device in block 606. For example, a pressure sensitive adhesive can be applied as a film, or a liquid or gel adhesive can be applied in a spray-on or print process. A decision is made as to whether or not the application of the adhesive requires a pressure treatment in decision block 608. If not, the "NO" branch of decision block 608 is taken, and the method continues in block 612 as described below. If the application of the adhesive requires a pressure treatment, the "YES" branch of decision block 608 is taken, a pressure treatment is applied to the cover adhesive layer in block 610, and the method continues in block 612. An LCD panel adhesive layer is applied to the touch panel device in block 612. For example, a pressure sensitive adhesive can be applied as a film, or a liquid or gel adhesive can be applied in a spray-on or print process. A decision is made as to whether or not the application of the adhesive requires a pressure treatment in decision block 614. If not, the "NO" branch of decision block 614 is taken, and the ends in block 618. If the application of the adhesive requires a pressure treatment, the "YES" branch of decision block 614 is taken, a pressure treatment is applied to the LCD panel adhesive layer in block 616, and the method ends in block 618.

Figure 7:
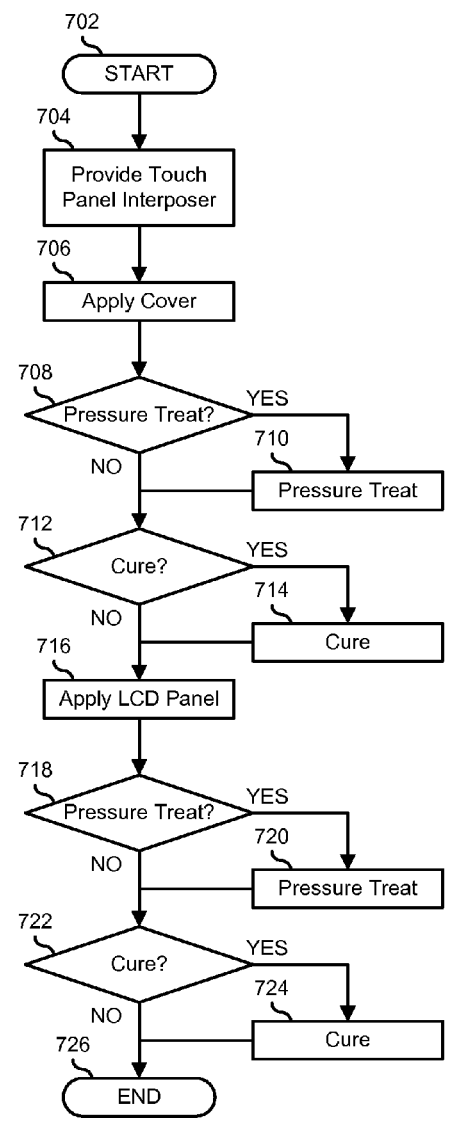
FIG. 7 is a flow diagram of a method of assembling a touch panel display according to an embodiment of the present disclosure.

FIG. 7 illustrates a method of assembling a touch panel display beginning at block 702. A touch panel interposer is provided in block 704. For example, a touch panel interposer can be manufactured as described in the method of FIG. 6. The skilled artisan will recognize that the steps of the method can be performed in a different order than the steps as illustrated, as needed or desired. A cover is applied to the touch panel interposer in block 706. For example, a glass cover, an acrylic cover, or another type of cover, as needed or desired, can be applied to the touch panel interposer. A decision is made as to whether or not the application of the cover requires a pressure treatment in decision block 708. If not, the "NO" branch of decision block 708 is taken, and the method continues in decision block 712 as described below. If the application of the cover requires a pressure treatment, the "YES" branch of decision block 708 is taken, a pressure treatment is applied to the cover in block 710, and the method continues in decision block 712. A decision is made as to whether or not the application of the cover requires a curing treatment in decision block 712. If not, the "NO" branch of decision block 712 is taken, and the method continues in block 716 as described below. If the application of the cover requires a curing treatment, the "YES" branch of decision block 712 is taken, a curing treatment is applied to the cover in block 714, and the method continues in block 716.

An LCD panel is applied to the touch panel interposer in block 716. A decision is made as to whether or not the application of the LCD panel requires a pressure treatment in decision block 718. If not, the "NO" branch of decision block 718 is taken, and the method continues in decision block 722 as described below. If the application of the LCD panel requires a pressure treatment, the "YES" branch of decision block 718 is taken, a pressure treatment is applied to the LCD panel in block 720, and the method continues in decision block 722. A decision is made as to whether or not the application of the LCD panel requires a curing treatment in decision block 722. If not, the "NO" branch of decision block 722 is taken, and the method end in block 726. If the application of the LCD panel requires a curing treatment, the "YES" branch of decision block 722 is taken, a curing treatment is applied to the LCD panel in block 724, and the method ends in block 726.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method comprising:
   providing a touch panel interposer, including:
   providing a touch panel device;
   applying a first adhesive layer to a cover side of the touch panel device, wherein the first adhesive layer includes an ink to enhance an adhesive property of an adhesive of the first adhesive layer;
   applying a second adhesive layer in direct physical contact with a display side of the touch panel device including applying only a barrier adhesive to a bezel of the touch panel device; and
   an air gap maintained between electrodes during an operation of the touch panel device; and
   providing a touch panel display, including:
   applying a cover to the first adhesive layer; and
   applying a display panel in direct physical contact with the barrier adhesive, wherein the air gap separates the electrodes from contacting a surface of the display panel.

2. The method of claim 1, wherein:
   providing the touch panel interposer further comprises:
   applying a first protective cover to the first adhesive layer; and
   applying a second protective cover to the second adhesive layer; and
   providing the touch panel display further comprises:
   removing the first protective cover from the first adhesive layer of the touch panel interposer prior to applying the cover to the first adhesive layer; and
   removing the second protective cover from the second adhesive layer of the touch panel interposer prior to applying the display panel to the second adhesive layer.

3. The method of claim 1, further comprising insulating the electrodes from the surface of the display panel via the air gap.

4. The method of claim 1, wherein:
   at least one of the first adhesive layer and the second adhesive layer is a pressure sensitive adhesive film; and
   providing the touch panel display further comprises:
   applying a pressure treatment to the touch panel.

5. The method of claim 1, wherein:
   at least one of the first adhesive layer and the second adhesive layer is a gel adhesive; and
   providing the touch panel display further comprises:
   applying a curing treatment to the touch panel.

6. The method of claim 5, wherein applying the curing treatment further comprises:
   exposing the touch panel display to an ultra-violet light source.

7. The method of claim 5, wherein applying the curing treatment further comprises:
   exposing the touch panel display to temperature treatment.

8. The method of claim 5, wherein applying the curing treatment further comprises:
   exposing the touch panel display in an autoclave.

9. The method of claim 1, wherein the touch panel device comprises at least one of a projected capacitive panel device, a mutual capacitive panel device, and a self capacitive panel device.

10. A touch panel display comprising:
    a touch panel interposer including:
    a touch panel device;
    a first adhesive layer bonded to a cover side of the touch panel device, wherein the first adhesive layer includes an ink to change a curing property of an adhesive of the first adhesive layer; and
    a second adhesive layer bonded to a display side of the touch panel device, wherein the second adhesive layer comprises only a barrier adhesive applied at a bezel of the touch panel device to form an environmental barrier surrounding electrodes associated with the touch panel device;
    an air gap maintained between the electrodes during an operation of the touch panel device;
    a cover bonded to the first adhesive layer; and
    a display panel bonded in direct physical contact with the barrier adhesive;
    wherein the air gap electrically insulates the electrodes from contacting a surface of the display panel.

11. The touch panel display of claim 10, wherein the display panel is direct bonded to the touch panel device.

12. The touch panel display of claim 10, wherein at least one of the first adhesive layer and the second adhesive layer is a pressure sensitive adhesive film.

13. The touch panel display of claim 10, wherein at least one of the first adhesive layer and the second adhesive layer is a gel adhesive.

14. The touch panel display of claim 10, wherein the touch panel device comprises at least one of a projected capacitive panel device, a mutual capacitive panel device, and a self capacitive panel device.

15. The method of claim 1, wherein the barrier adhesive is not transparent.

16. The touch panel display of claim 10, wherein the barrier adhesive is transparent.

17. A touch panel display comprising:
    a touch panel interposer including:
    a touch panel device;
    a first adhesive layer bonded to a cover side of the touch panel device, wherein the first adhesive layer includes an ink to change a curing property of an adhesive of the first adhesive layer; and
    a second adhesive layer bonded to a display side of the touch panel device, wherein the second adhesive layer comprises only a barrier adhesive applied at a bezel of the touch panel device to form an environmental barrier surrounding electrodes associated with the touch panel device;
    an air gap maintained between the electrodes during an operation of the touch panel device;
    a cover bonded to the first adhesive layer; and
    a display panel bonded in direct physical contact with the barrier adhesive;
    wherein the air gap electrically insulates the electrodes from contacting a surface of the display panel, the display panel is direct bonded to the touch panel device, and at least one of the first adhesive layer and the second adhesive layer is a pressure sensitive adhesive film.

* * * * *